US011415369B2

United States Patent
Kuk et al.

(10) Patent No.: US 11,415,369 B2
(45) Date of Patent: Aug. 16, 2022

(54) CRUCIBLE WITH REACTION PREVENTING LAYER MADE OF ADVANCED MATERIAL AND METHOD OF MELTING AND CASTING METAL FUEL USING THE SAME

(71) Applicant: KOREA ATOMIC ENERGY RESEARCH INSTITUTE, Daejeon (KR)

(72) Inventors: Seoung Woo Kuk, Daejeon (KR); Kyung Chai Jeong, Cheongju-si (KR); Seok Jin Oh, Daejeon (KR); Jeong-Yong Park, Daejeon (KR); Ki Hwan Kim, Sejong-si (KR); Yoon Myeng Woo, Daejeon (KR); Seung Uk Mun, Gyeongsan-si (KR); Seong-Jun Ha, Daejeon (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 15 days.

(21) Appl. No.: 17/100,180

(22) Filed: Nov. 20, 2020

(65) Prior Publication Data
US 2021/0148637 A1    May 20, 2021

(30) Foreign Application Priority Data

Nov. 20, 2019 (KR) .................. 10-2019-0149199
Jun. 24, 2020 (KR) .................. 10-2020-0077193

(51) Int. Cl.
F27B 14/10    (2006.01)
B22D 41/02    (2006.01)
C30B 15/10    (2006.01)

(52) U.S. Cl.
CPC .............. *F27B 14/10* (2013.01); *B22D 41/02* (2013.01); *C30B 15/10* (2013.01); *F27B 2014/104* (2013.01)

(58) Field of Classification Search
None
See application file for complete search history.

(56) References Cited

U.S. PATENT DOCUMENTS

| 2003/0109372 | A1* | 6/2003 | Hasegawa | F27B 5/13 501/95.2 |
| 2004/0102308 | A1* | 5/2004 | Simpson | C04B 35/486 428/34.4 |
| 2021/0148637 | A1* | 5/2021 | Kuk | F27B 14/10 |

FOREIGN PATENT DOCUMENTS

| JP | H 04-164858 | 6/1992 |
| JP | 2015-161459 | 9/2015 |
| KR | 101189169 | 10/2012 |
| KR | 10-2014-0044595 | 4/2014 |

OTHER PUBLICATIONS

Seoungwoo Kuk et al., "Loss control of casting methods for metallic fuel fabrication", Transactions of the Korean Nuclear Society Spring Meeting, Jeju, Korea, May 23-24, 2019.
KIPO, Office Action of KR 10-2020-0077193 dated May 20, 2021.

* cited by examiner

*Primary Examiner* — Scott R Kastler
(74) *Attorney, Agent, or Firm* — Lex IP Meister, PLLC

(57) ABSTRACT

The present invention provides a crucible for melting and casting a metal fuel, which includes a reaction preventing layer including: $LaYO_3$; or $ZrO_2$ containing a $Y_2O_3$ stabilizer at 5 to 10 wt %, and a method of melting and casting a metal fuel using the same.

9 Claims, 5 Drawing Sheets

CRUCIBLE WITH REACTION PREVENTING LAYER MADE OF ADVANCED MATERIAL AND METHOD OF MELTING AND CASTING METAL FUEL USING THE SAME

CROSS-REFERENCE TO RELATED APPLICATION

This application claims priority to and the benefit of Korean Patent Applications No. 10-2019-0149199, filed on 20 Nov. 2019, and No. 10-2020-0077193, filed on 24, Jun. 2020, the disclosures of which are incorporated herein by reference in its entirety.

BACKGROUND

1. Field of the Invention

The present invention relates to a crucible with a reaction preventing layer made of an advanced material and a method of melting and casting a metal fuel using the same.

2. Discussion of Related Art

Generally, in a sodium-cooled fast reactor (SFR), raw materials of various compositions such as U—Zr, U—Zr-RE (rare-earth elements), U—Zr-TRU (transuranium)-RE, and the like, which are metal fuels, are melted and casted at high temperatures under vacuum to manufacture metal fuel slugs, and the metal fuel slugs are subjected to a subsequent process and then used as nuclear fuel.

Crucibles conventionally used in the process of melting and casting a metal fuel are made of graphite, and the graphite crucible and a melt react to form a carbide, which degrades the quality of the melt and restricts the recycling of the melt, leading to a reduction in the yield of nuclear fuel, an issue of the justification of nuclear fuel recycling, and impossibility of crucible recycling.

Accordingly, prior research has been conducted on application of $ZrO_2$, $Y_2O_3$, and the like as a reaction preventing layer to the graphite crucible, but the application also has a problem of reaction with highly reactive materials (lanthanide, etc.) contained in a melt.

PRIOR-ART DOCUMENTS

Patent Documents

Korean Registered Patent No. 10-1189169 (2012.10.02)

SUMMARY OF THE INVENTION

The present invention is directed to providing a crucible for melting and casting a metal fuel, which is intended to effectively suppress a reaction between the crucible and a metal fuel melt, and the crucible includes a reaction preventing layer which is made of an advanced material and includes: $LaYO_3$; or $ZrO_2$ containing a $Y_2O_3$ stabilizer at 5 to 10 wt %.

However, technical problems to be solved in the present invention are not limited to the above-described problems, and other problems which are not described herein will be clearly understood by those of ordinary skill in the art from the following description.

One aspect of the present invention provides a crucible for melting and casting a metal fuel, which includes a reaction preventing layer including: $LaYO_3$; or $ZrO_2$ containing a $Y_2O_3$ stabilizer at 5 to 10 wt %.

Another aspect of the present invention provides a method of melting and casting a metal fuel, which includes the steps of: (a) manufacturing a reaction preventing layer including: $LaYO_3$; or $ZrO_2$ containing a $Y_2O_3$ stabilizer at 5 to 10 wt %; (b) applying the reaction preventing layer to a crucible; and (c) inputting a metal fuel into the crucible with the reaction preventing layer and then melting and casting the metal fuel.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
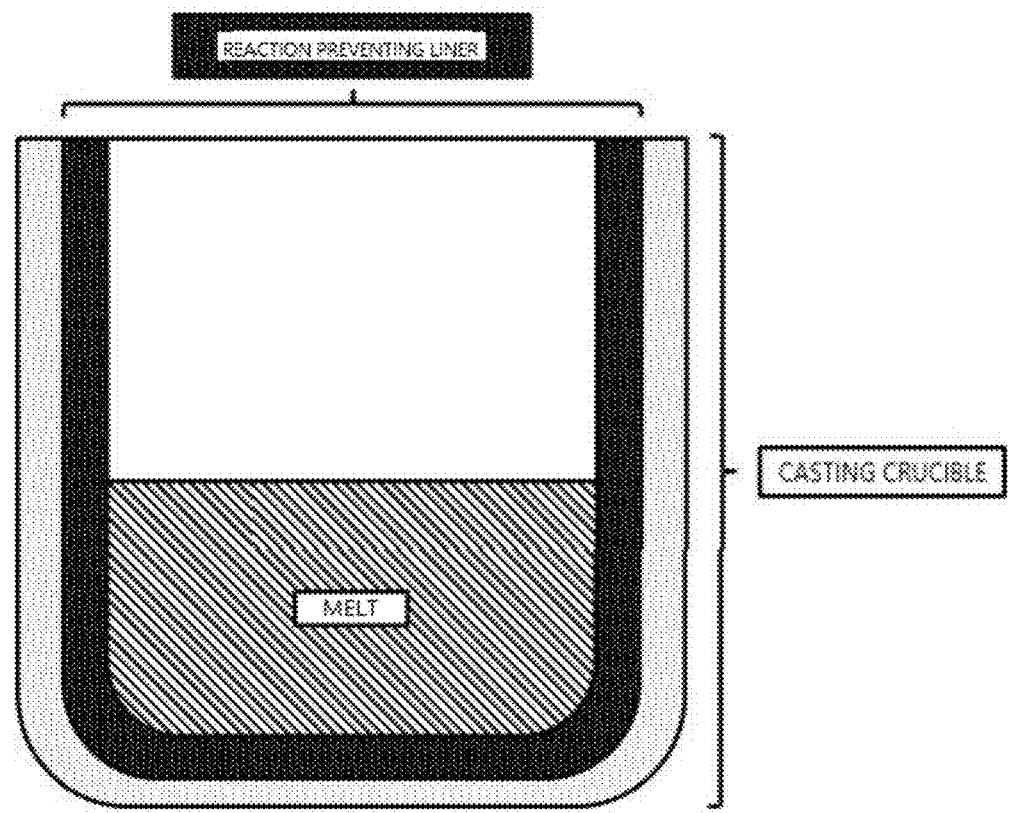
FIG. 1 shows a crucible for melting and casting a metal fuel, to which a reaction preventing layer is applied in the form of a liner, according to one embodiment of the present invention.

The inventors of the present invention have conducted research on a reaction preventing layer made of an advanced material, which is intended for application to a crucible for melting and casting a metal fuel and found that, when a reaction preventing layer including: $LaYO_3$; or $ZrO_2$ containing a $Y_2O_3$ stabilizer at 5 to 10 wt % is manufactured through an optimized process and then applied, and, optionally, a sacrificial layer is further applied, a reaction between a crucible and a melt can be effectively prevented, or the degree of contamination of a metal fuel melt can be improved. Therefore, the present invention has been completed based on this fact.

Hereinafter, the present invention will be described in detail.

Crucible for Melting and Casting Metal Fuel

The present invention provides a crucible for melting and casting a metal fuel, which includes a reaction preventing layer including: $LaYO_3$; or $ZrO_2$ containing a $Y_2O_3$ stabilizer at 5 to 10 wt %.

As used herein, a "crucible for melting and casting a metal fuel" is used to manufacture a metal fuel slug by melting and casting a highly reactive metal fuel having a high melting point and needs to be separable from the manufactured metal fuel slug without physical impact for recycling. Meanwhile, when the crucible contacts and reacts with a fuel of the metal fuel, the constituent of the crucible penetrates the metal fuel melt, and thus impurities in the metal fuel increase in recycling thereof, and the quality of a metal fuel slug is degraded. Therefore, it is necessary to prevent the contact and reaction.

As used herein, a "metal fuel" is a raw material that is to be melted and casted to manufacture a metal fuel slug and may include one or more selected from the group consisting of elements 21 to 29, 39 to 47, 57 to 79, and 89 to 111 in the periodic table. Among those listed above, metal fuel materials, such as U, Ni, Cu, Zr, Ta, Mo, Mn, Cr, Fe, Nb, Ti, and the like, and other lanthanide and actinide elements have high melting points and high reactivity characteristics.

The present invention has a feature in that a reaction preventing layer is applied to the crucible, and the reaction preventing layer serves to effectively prevent a reaction between the crucible and a melt or improve the degree at which the constituent of the reaction preventing layer spreads to a metal fuel melt (i.e., degree of contamination of a metal fuel melt). Specifically, the reaction preventing layer is a reaction preventing layer made of an advanced material and includes: $LaYO_3$; or $ZrO_2$ containing a $Y_2O_3$ stabilizer at 5 to 10 wt %, which is a composite metal oxide.

First, $LaYO_3$, which is a composite metal oxide, provides a better effect of preventing a reaction between a crucible and a melt (particularly, highly reactive material having a high melting point) than $ZrO_2$, $Y_2O_3$, or the like which is a single metal oxide, and this is because lanthanum (La) serves to increase the entropy of the ceramic material. $LaYO_3$, which is a composite metal oxide, may be formed by mixing $La_2O_3$ and $Y_2O_3$ in a molar ratio of 1.5:1 to 1:2 and is preferably formed in a molar ratio of 1:1 to 1:2, but the present invention is not limited thereto. In this case, a larger amount of $Y_2O_3$ than $La_2O_3$ may be used due to problems such as volatilization and the like.

In addition, $ZrO_2$ containing a $Y_2O_3$ stabilizer at 5 to 10 wt %, which is a composite metal oxide, provides a better effect of preventing a reaction between a crucible and a melt (particularly, highly reactive material having a high melting point) than $ZrO_2$, $Y_2O_3$, or the like which is a single metal oxide, and this is because the $Y_2O_3$ stabilizer contained in an optimal amount serves to maximize the reaction prevention effect of $ZrO_2$. Meanwhile, when a very slight amount of the $Y_2O_3$ stabilizer is contained, a thermal shock phenomenon may occur due to the phase change of $ZrO_2$ containing the $Y_2O_3$ stabilizer. However, since $ZrO_2$ containing the $Y_2O_3$ stabilizer at 5 to 10 wt %, which is a composite metal oxide, contains a zirconia component, the zirconia component may penetrate and contaminate a melt.

The reaction preventing layer needs to maintain high density and high purity to maximize the effect of preventing a reaction between a crucible and a melt. Specifically, the density of the reaction preventing layer may be 80% or more (preferably, 90% or more) of theoretical density (T.D.), and this high density can be considered as a result of the manufacture through an optimized process to be described below. When the reaction preventing layer has a very low density, a melt may flow into the reaction preventing layer. In addition, the purity of the reaction preventing layer may be 90% or more, and this purity can also be considered as a result of the manufacture through an optimized process to be described below. When the reaction preventing layer has a very low purity, impurities present in the reaction preventing layer may react with a melt.

Figure 2:
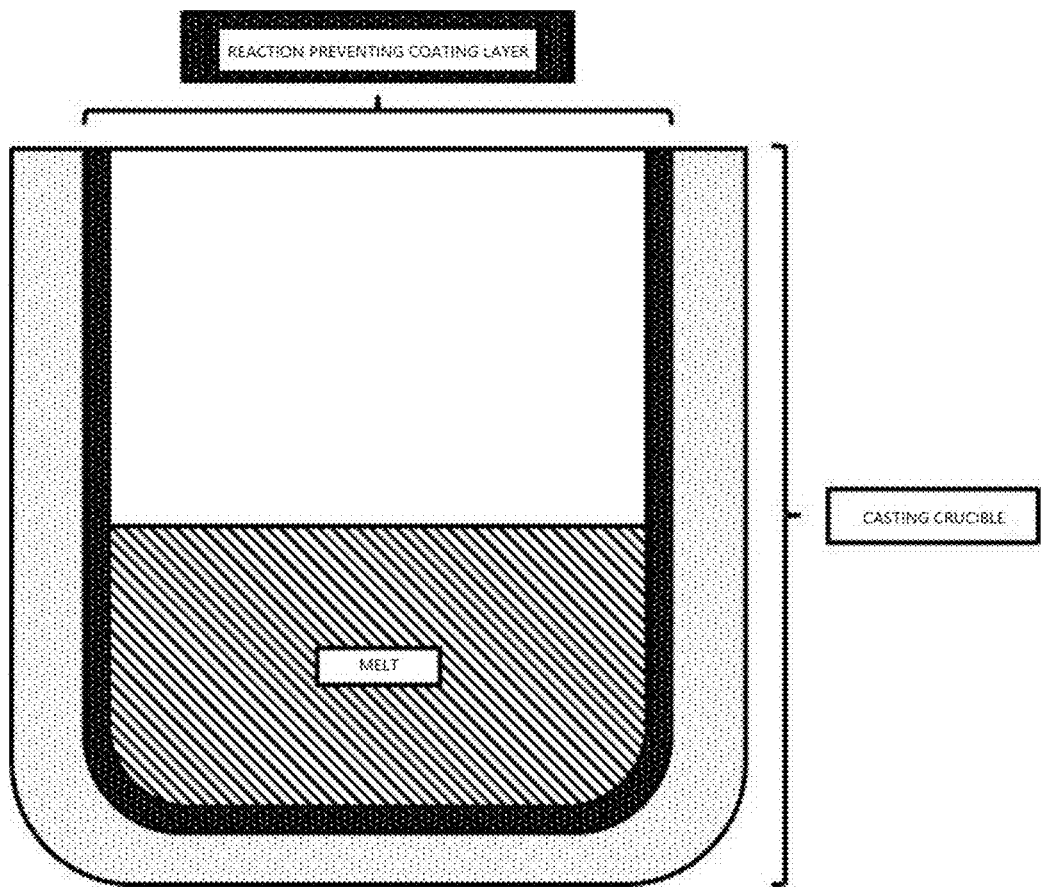
FIG. 2 shows a crucible for melting and casting a metal fuel, to which a reaction preventing layer is applied in the form of a coating layer, according to another embodiment of the present invention.
Figure 3:
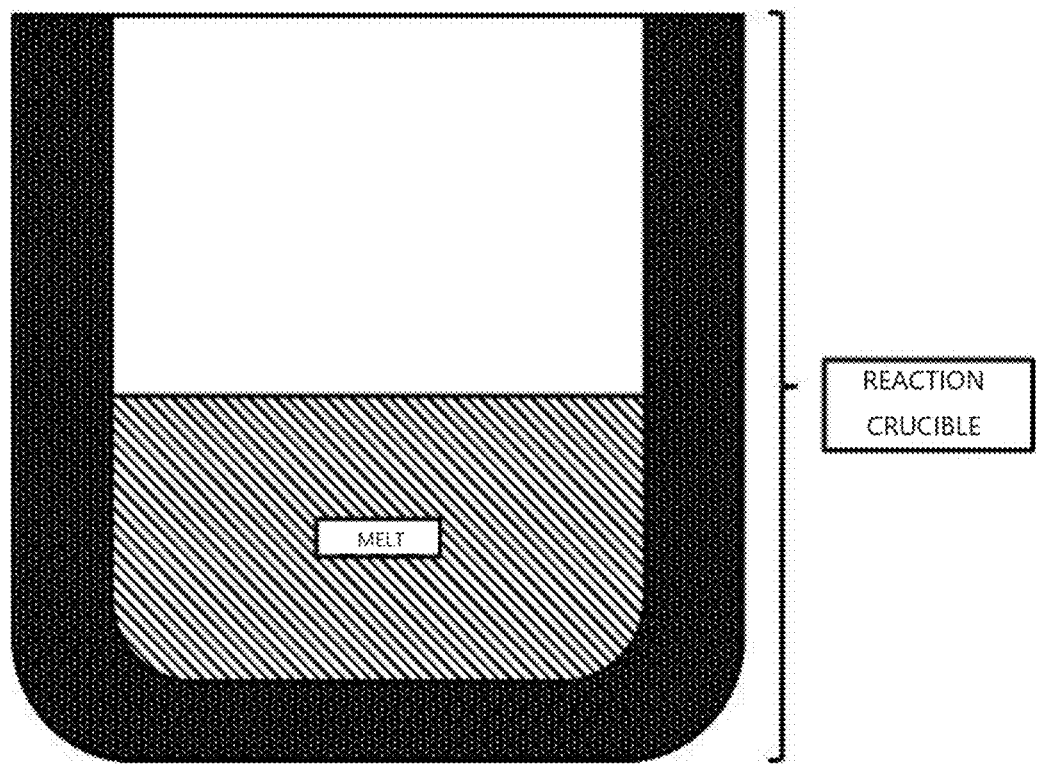
FIG. 3 shows a crucible for melting and casting a metal fuel, to which a reaction preventing layer is applied as a whole, according to still another embodiment of the present invention.

Meanwhile, the reaction preventing layer may be formed on a surface of the crucible in contact with the metal fuel melt, and various embodiments thereof are shown in FIGS. 1 to 3. Specifically, the reaction preventing layer may be manufactured in the form of a liner in the crucible (FIG. 1). Alternatively, the reaction preventing layer may be manufactured in the form of a coating layer in the crucible (FIG. 2). Alternatively, the reaction preventing layer itself may constitute the crucible (FIG. 3). All three cases may be used in general melting utilization processes resulting from the transfer of heat sources by radiant and conductive heat, but the case where the reaction preventing layer itself constitutes the crucible (i.e, ceramic crucible) has a limitation in use in an inductive melting utilization process and a problem in which thermal shock occurs due to an increase in ceramic thickness, leading to the breakage of a melt. Therefore, the most preferable form of the reaction preventing layer is a liner form in consideration of the density, purity, and thickness thereof.

The reaction preventing layer may have a thickness of 10 μm to 5 mm, and when manufactured in the form of a liner, the reaction preventing layer preferably has a thickness of 0.5 mm to 5 mm. When the thickness is excessively increased, thermal damage may occur, and conductive heat generated during casting due to the low thermal conductivity of a ceramic may be blocked. Meanwhile, when manufactured in the form of a coating layer, the reaction preventing layer preferably has a thickness of 10 μm to 300 μm, and when the thickness is below the above-described range, a reaction between a crucible and a melt may not be effectively prevented.

Optionally, a sacrificial layer formed on the reaction preventing layer may be further included. The sacrificial layer disappears after being used once because it is formed, preferably, by a spray or slurry coating method. The sacrificial layer may include a component different from the reaction preventing layer, or may include the same component as the reaction preventing layer. Specifically, the sacrificial layer may include $Y_2O_3$, or may include $LaYO_3$; or $ZrO_2$ containing a $Y_2O_3$ stabilizer at 5 to 10 wt %. The further included sacrificial layer may provide an effect of more effectively preventing a reaction between a crucible and the melt and improving the degree at which the constituent of the reaction preventing layer spreads to a metal fuel melt (i.e., degree of contamination of a metal fuel melt). The sacrificial layer may have a thickness of 5 μm to 100 μm.

Method of Melting and Casting Metal Fuel

The present invention provides a method of melting and casting a metal fuel, which includes the steps of: (a) manufacturing a reaction preventing layer including: $LaYO_3$; or $ZrO_2$ containing a $Y_2O_3$ stabilizer at 5 to 10 wt %; (b) applying the reaction preventing layer to a crucible; and (c) inputting a metal fuel into the crucible with the reaction preventing layer and then melting and casting the metal fuel.

First, the method of melting and casting a metal fuel according to the present invention includes the step of manufacturing a reaction preventing layer including: LaYO$_3$; or ZrO$_2$ containing a Y$_2$O$_3$ stabilizer at 5 to 10 wt % [Step (a)].

The reaction preventing layer includes: LaYO$_3$; or ZrO$_2$ containing a Y$_2$O$_3$ stabilizer at 5 to 10 wt %, which have been described above, and a repeated description thereof is omitted.

To manufacture the reaction preventing layer in the form of a liner, the manufacture may be performed by one or more methods selected from the group consisting of spark plasma sintering, post-cold isostatic pressing (CIP) sintering, and post-hot isostatic pressing (HIP) sintering, thereby increasing the density of the reaction preventing layer up to 80% or more of theoretical density (T.D.).

When spark plasma sintering is applied as the manufacturing method, the reaction preventing layer is easily manufactured, but it is difficult to manufacture a large-sized specimen, and carbon contamination occurs. Therefore, it is preferable to apply post-CIP sintering or post-HIP sintering so as to ensure a sufficient density of the reaction preventing layer.

Specifically, when post-CIP sintering is applied as the manufacturing method, the pressure applied in the CIP may range from 10 to 200 MPa, and the temperature and time applied in the sintering may range from 1,200 to 1,700° C. and from 2 to 30 hours, respectively. Specifically, the sintering may be performed by raising a temperature from room temperature to 800 to 1,200° C. at 0.1 to 10° C./min and maintaining the temperature for 5 to 20 hours, raising the temperature to 1,300 to 1,700° C. at 0.1 to 10° C./min and maintaining the temperature for 3 to 10 hours, and lowering the temperature to room temperature at 0.1 to 10° C./min. As a result, the density of the reaction preventing layer may be improved.

Meanwhile, to manufacture the reaction preventing layer in the form of a coating layer, the manufacture may be performed by a known sintering or coating method and is preferably performed by a spray or slurry coating method, but the present invention is not limited thereto.

Next, the method of melting and casting a metal fuel according to the present invention includes the step of applying the reaction preventing layer to a crucible [Step (b)].

When the reaction preventing layer is manufactured in the form of a liner, the application may be performed by insertion after the manufacture. Meanwhile, when the reaction preventing layer is manufactured in the form of a coating layer, the application may be performed at the same time as the manufacture.

Optionally, after the Step (b), the step of further forming a sacrificial layer containing Y$_2$O$_3$ on the reaction preventing layer may be included. Descriptions of the sacrificial layer have been described above, and a repeated description thereof is omitted. The further formation may be performed by a known sintering or coating method and is preferably performed by a spray or slurry coating method, but the present invention is not limited thereto.

Next, the method of melting and casting a metal fuel according to the present invention includes the step of inputting a metal fuel into the crucible with the reaction preventing layer and then melting and casting the metal fuel [Step (c)].

The melting and casting processes may encompass all of general melting utilization processes resulting from the transfer of heat sources by radiant and conductive heat and an inductive melting utilization process by induced current. Specifically, the melting and casting may be performed by applying a pressure of 1.2 bar to 5 bar at 1,000° C. to 1,800° C. and 5×10$^{-3}$ Torr or less, and high-purity inert gas (Ar, N$_2$, etc.) may be used to maintain the pressure, and it is necessary to prevent the inflow of an active gas such as external O$_2$, etc.

In addition, a metal fuel slug manufactured by the melting and casting may be provided.

As described above, the crucible for melting and casting a metal fuel according to the present invention is characterized by including a reaction preventing layer including: LaYO$_3$; or ZrO$_2$ containing a Y$_2$O$_3$ stabilizer at 5 to 10 wt %, and the reaction preventing layer can effectively suppress a reaction between the crucible and a melt or improve the degree of contamination of a metal fuel melt, which improves the quality of the melt and thus make it possible to recycle not only the melt but also the crucible. Therefore, it is possible to improve the yield of the metal fuel, control loss, reduce costs, and minimize waste. In particular, when the metal fuel contains a nuclear fuel material, the justification of nuclear fuel recycling can be ensured, and it can be widely used as a technology for reducing radioactive waste.

In addition, since the reaction preventing layer is manufactured in the crucible for melting and casting a metal fuel according to the present invention through an optimized process, optionally, a sacrificial layer is further applied thereto, and a metal fuel is melted and casted under optimized conditions, the effect of the reaction preventing layer can be maximized.

Hereinafter, exemplary examples of the present invention will be described for promoting understanding of the present invention. However, the following examples should be considered in a descriptive sense only, and the scope of the invention is not limited to the examples.

EXAMPLES

Example 1: Application of LaYO$_3$ Liner Manufactured by Post-CIP Sintering

Figure 4:
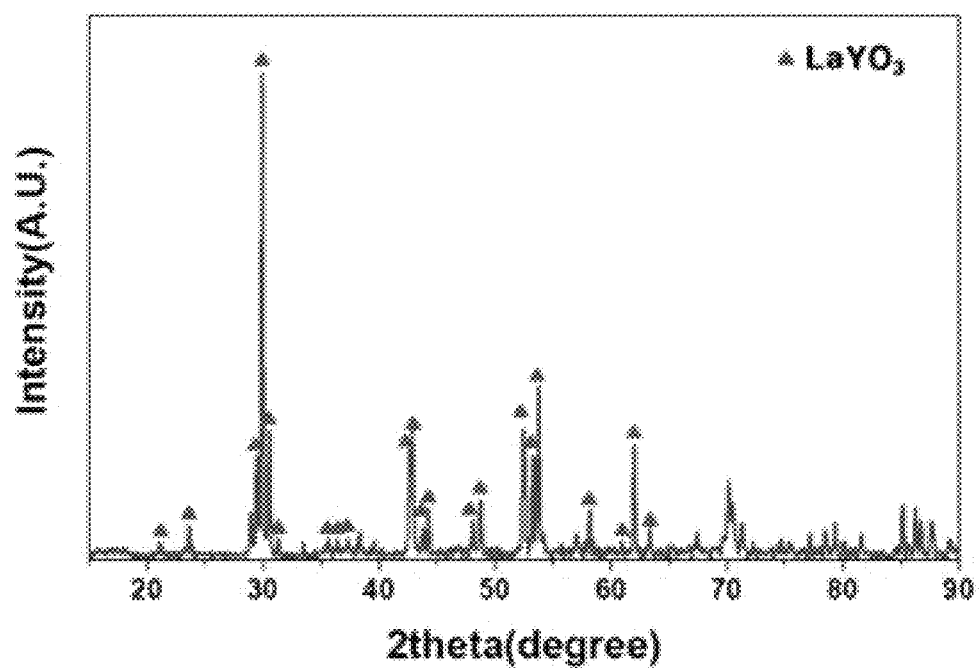
FIG. 4 is a result of measuring a $LaYO_3$ liner manufactured in Examples 1 and 2 by means of X-ray diffraction (XRD) analysis.

La$_2$O$_3$ and Y$_2$O$_3$ were mixed in a molar ratio of 1:1.3 to prepare LaYO$_3$ powder in particle form. In this case, a larger amount of Y$_2$O$_3$ than La$_2$O$_3$ was used due to problems such as volatilization and the like. The particle-shaped LaYO$_3$ powder was input into a rubber mold with a predetermined shape, and cold isostatic pressing (CIP) was performed by applying a pressure ranging from 10 to 200 MPa to form a predetermined-shaped molded article. Afterward, sintering was performed under atmospheric conditions without separately applying a pressure to form the molded article with a desired shape, thereby manufacturing a 3 mm-thick LaYO$_3$ single-phase liner (5.95 g/cm$^3$; 94% of theoretical density (T.D.)) (source: Dandan Co., Ltd/Korea Atomic Energy Research Institute) (FIG. 4). In this case, the sintering was performed by raising a temperature from room temperature to 1,000° C. at 1° C./min and maintaining the temperature for 10 hours, raising the temperature to 1,500° C. at 0.5° C./min and maintaining the temperature for 6 hours, and lowering the temperature to room temperature at 2° C./min. Afterward, the LaYO$_3$ single-phase liner was inserted into a crucible made of graphite.

Then, a highly reactive metal fuel (U-10Zr-3RE) was input thereinto and pressurized with a pressure of 2.4 bar at 1,600° C. to manufacture a metal fuel slug.

Example 2: Application of LaYO$_3$ Liner Manufactured by Post-CIP Sintering and Further Application of Sacrificial Layer Cold isostatic pressing (CIP) and sintering were sequentially performed in the same manner as in Example 1, thereby manufacturing a 3 mm-thick LaYO$_3$ single-phase liner (5.95 g/cm$^3$; 94% of theoretical density (T.D.)) (source: Dandan Co., Ltd/Korea Atomic Energy Research Institute) (FIG. 4), and the LaYO$_3$ single-phase liner was inserted into a crucible made of graphite. A 20 μm-thick Y$_2$O$_3$ sacrificial layer was further applied on the LaYO$_3$ single-phase liner by a spray coating method.

Then, a highly reactive metal fuel was melted and casted in the same manner as in Example 1.

Example 3: Application of 8 wt % Y$_2$O$_3$ Stabilizer-Containing ZrO$_2$ Liner Manufactured by Post-CIP Sintering Cold isostatic pressing (CIP) and sintering were sequentially performed in the same manner as in Example 1, thereby manufacturing a 3 mm-thick ZrO$_2$ liner containing a Y$_2$O$_3$ stabilizer at 8 wt % (5.95 g/cm$^3$; 100% of theoretical density (T.D.)) (source: Dandan Co., Ltd/Korea Atomic Energy Research Institute), and the ZrO$_2$ liner was inserted into a crucible made of graphite.

Then, a highly reactive metal fuel was melted and casted in the same manner as in Example 1.

Example 4: Application of 8 wt % Y$_2$O$_3$ Stabilizer-Containing ZrO$_2$ Liner Manufactured by Post-CIP Sintering and Further Application of Sacrificial Layer Cold isostatic pressing (CIP) and sintering were sequentially performed in the same manner as in Example 1, thereby manufacturing a 3 mm-thick ZrO$_2$ liner containing a Y$_2$O$_3$ stabilizer at 8 wt % (5.95 g/cm$^3$; 100% of theoretical density (T.D.)) (source: Dandan Co., Ltd/Korea Atomic Energy Research Institute), and the ZrO$_2$ liner was inserted into a crucible made of graphite. A 20 μm-thick Y$_2$O$_3$ sacrificial layer was further applied on the ZrO$_2$ liner containing a Y$_2$O$_3$ stabilizer at 8 wt % by a spray coating method.

Then, a highly reactive metal fuel was melted and casted in the same manner as in Example 1.

Comparative Example 1: Application of Y$_2$O$_3$ Liner Manufactured by Post-CIP Sintering Cold isostatic pressing (CIP) and sintering were sequentially performed in the same manner as in Example 1, thereby manufacturing a 3 mm-thick Y$_2$O$_3$ liner, and the Y$_2$O$_3$ liner was inserted into a crucible made of graphite.

Then, a highly reactive metal fuel was melted and casted in the same manner as in Example 1.

Comparative Example 2: Application of Y$_2$O$_3$ Liner Manufactured by Post-CIP Sintering and Further Application of Sacrificial Layer Cold isostatic pressing (CIP) and sintering were sequentially performed in the same manner as in Example 1, thereby manufacturing a 3 mm-thick Y$_2$O$_3$ liner, and the Y$_2$O$_3$ liner was inserted into a crucible made of graphite. A 20 μm-thick Y$_2$O$_3$ sacrificial layer was further applied on the Y$_2$O$_3$ liner by a spray coating method.

Then, a highly reactive metal fuel was melted and casted in the same manner as in Example 1.

Figure 5:
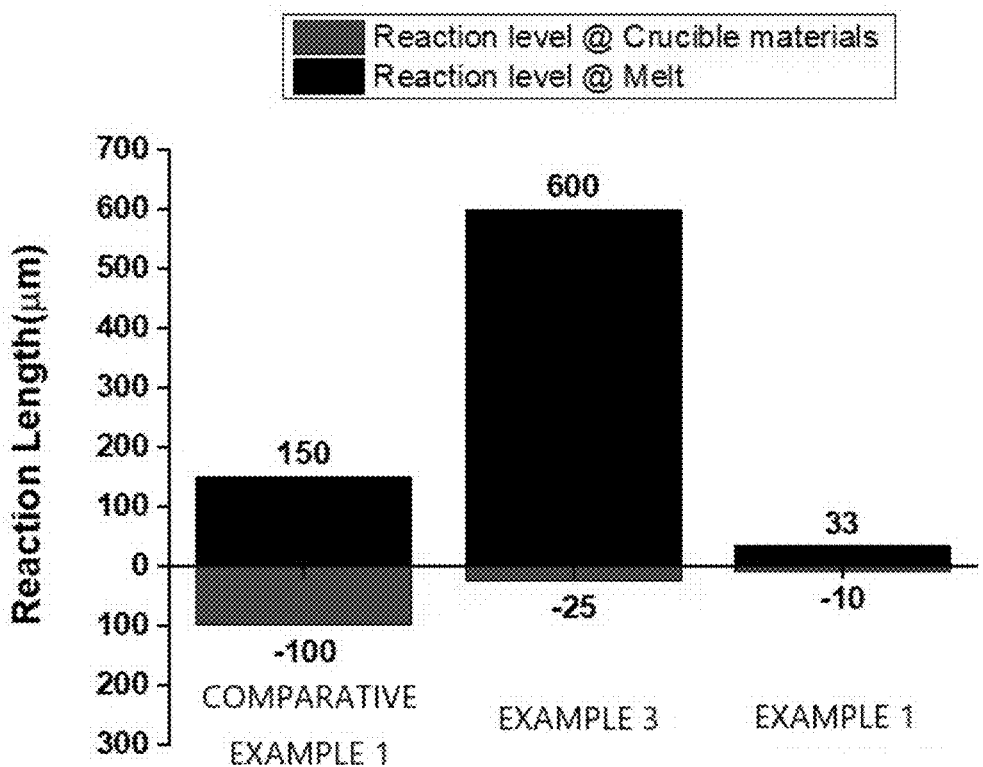
FIG. 5 is a result showing that, when individual reaction preventing layers manufactured in Examples 1 and 3 are applied, the reactivity with a metal fuel melt is substantially lowered compared to a case where a reaction preventing layer manufactured in Comparative Example 1 is applied.

FIG. 5 is a result showing that, when the individual reaction preventing layers manufactured in Examples 1 and 3 are applied, the reactivity with a metal fuel melt is substantially lowered compared to a case where the reaction preventing layer manufactured in Comparative Example 1 is applied.

As shown in FIG. 5, in the case of Example 1 including LaYO$_3$ as a reaction preventing layer without a sacrificial layer, it is confirmed that, as compared to Comparative Example 1, the reactivity with a metal fuel melt is lowered to about 1/10 (red), and the degree at which the constituent of a reaction preventing layer spreads to a metal fuel melt (i.e., degree of contamination of a metal fuel melt) is also lowered to about 1/5 (black). Meanwhile, in the case of Example 3 including ZrO$_2$ containing a Y$_2$O$_3$ stabilizer at 8 wt % as a reaction preventing layer without a sacrificial layer, it is confirmed that, as compared to Comparative Example 1, the degree of contamination of a metal fuel melt increases (black), but the reactivity with a metal fuel melt is lowered to about 1/4 (red).

Figure 6:
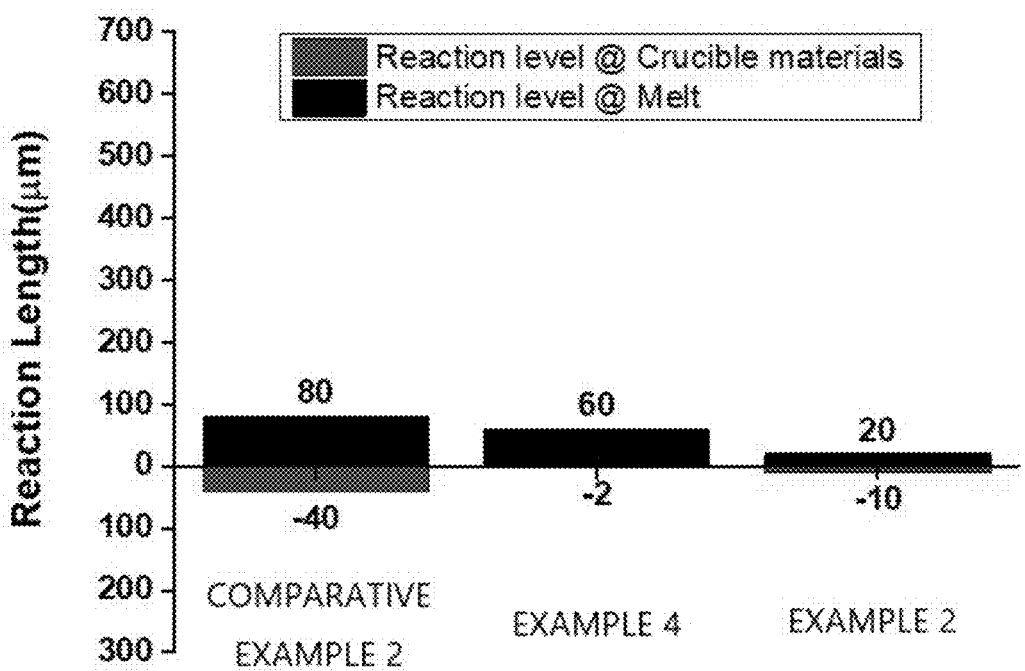
FIG. 6 is a result showing that, when individual reaction preventing layers and sacrificial layers manufactured in Examples 2 and 4 are applied, the reactivity with a metal fuel melt is substantially lowered, and the degree of contamination of a metal fuel melt is also substantially improved compared to a case where a reaction preventing layer and a sacrificial layer manufactured in Comparative Example 2 are applied.

FIG. 6 is a result showing that, when the individual reaction preventing layers and sacrificial layers manufactured in Examples 2 and 4 are applied, the reactivity with a metal fuel melt is substantially lowered, and the degree of contamination of a metal fuel melt is also substantially improved compared to a case where the reaction preventing layer and the sacrificial layer, which are manufactured in Comparative Example 2, are applied.

As shown in FIG. 6, in the case of Example 2 including both LaYO$_3$ as a reaction preventing layer and a sacrificial layer and Example 4 including both ZrO$_2$ containing a Y$_2$O$_3$ stabilizer at 8 wt % as a reaction preventing layer and a sacrificial layer, it is confirmed that, as compared to Comparative Example 2, the reactivities with a metal fuel melt are lowered to about 1/4 and about 1/20, respectively (red), and the degrees of contamination of a metal fuel melt are also lowered to about 1/4 and about 3/4, respectively (black).

A crucible for melting and casting a metal fuel according to the present invention is characterized by including a reaction preventing layer including: LaYO$_3$; or ZrO$_2$ containing a Y$_2$O$_3$ stabilizer at 5 to 10 wt %, and the reaction preventing layer can effectively suppress a reaction between the crucible and a melt or improve the degree of contamination of a metal fuel melt, which improves the quality of the melt and thus make it possible to recycle not only the melt but also the crucible. Therefore, it is possible to improve the yield of the metal fuel, control loss, reduce costs, and minimize waste. In particular, when the metal fuel contains a nuclear fuel material, the justification of nuclear fuel recycling can be ensured, and it can be widely used as a technology for reducing radioactive waste.

In addition, since the reaction preventing layer is manufactured in the crucible for melting and casting a metal fuel according to the present invention through an optimized process, optionally, a sacrificial layer is further applied thereto, and a metal fuel is melted and casted under optimized conditions, the effect of the reaction preventing layer can be maximized.

The aforementioned description of the present invention is intended for illustration and those skilled in the art will understood that the present invention can be easily changed or modified into other specified forms without change or modification of the technical spirit or essential characteristics of the present invention. Therefore, it should be understood that the examples described above are only exemplary in all aspects and not limiting.

What is claimed is:

1. A crucible for melting and casting a metal fuel, comprising a reaction preventing layer including LaYO$_3$.

2. The crucible of claim 1, wherein the reaction preventing layer has a density of 80% or more of a theoretical density of the reaction preventing layer.

3. The crucible of claim 1, wherein a content of $LaYO_3$ of the reaction preventing layer is 90% or more.

4. The crucible of claim 1, wherein the reaction preventing layer is formed on a surface of the crucible in contact with a melt of the metal fuel.

5. The crucible of claim 1, wherein the reaction preventing layer has a thickness of 10 μm to 5 mm.

6. The crucible of claim 1, further comprising a sacrificial layer formed on the reaction preventing layer.

7. A method of melting and casting a metal fuel, comprising the steps of:
   (a) manufacturing a reaction preventing layer including $LaYO_3$;
   (b) applying the reaction preventing layer to a crucible; and
   (c) inputting a metal fuel into the crucible with the reaction preventing layer and then melting and casting the metal fuel.

8. The method of claim 7, wherein the manufacture in the step (a) is performed by one or more methods selected from the group consisting of spark plasma sintering, post-cold isostatic pressing (CIP) sintering, and post-hot isostatic pressing (HIP) sintering.

9. The method of claim 7, wherein the melting and casting in the step (c) are performed by applying a pressure of 1.2 bar to 5 bar at 1,000° C. to 1,800° C.

* * * * *